United States Patent [19]
Haley et al.

[11] Patent Number: 5,917,327
[45] Date of Patent: Jun. 29, 1999

[54] TECHNIQUE AND APPARATUS FOR TESTING ELECTROSTATIC CHUCKS

[75] Inventors: Mark W. Haley, Medina; Delbert H. Parks, San Antonio, both of Tex.

[73] Assignee: VLSI Technology, Inc., San Jose, Calif.

[21] Appl. No.: 08/929,172

[22] Filed: Sep. 8, 1997

[51] Int. Cl.⁶ .......................... G01R 29/12; H02N 13/00
[52] U.S. Cl. ............................................. 324/457; 361/234
[58] Field of Search .................................. 324/713, 718, 324/719, 452, 457, 158.1, 765; 73/862.471, 862.472, 862.68; 361/230, 233, 234, 235; 156/626.1, 627.1, 643.1, 345; 204/298.15, 298.32, 298.34; 216/59

[56] References Cited

U.S. PATENT DOCUMENTS

| | | | |
|---|---|---|---|
| 4,897,171 | 1/1990 | Ohmi | 156/345 |
| 5,459,632 | 10/1995 | Birang et al. | 361/234 |
| 5,491,603 | 2/1996 | Birang et al. | 361/234 |
| 5,684,669 | 11/1997 | Collins et al. | 361/234 |

*Primary Examiner*—Diep N. Do
*Attorney, Agent, or Firm*—Majestic, Parsons, Siebert & Hsue P.C.

[57] ABSTRACT

A testing apparatus including a testing plate can be used to test an electrostatic wafer chuck. A DC potential is supplied so as to produce an electrostatic force. A mechanical force is supplied to the testing plate in order to give an indication of the produced electrostatic force. By examining the DC potential and the produced electrostatic force, an electrostatic wafer chuck can be qualified or rejected before being placed into a wafer processing machine. This reduces the possibility of damage to the wafer or the wafer processing machine.

19 Claims, 2 Drawing Sheets

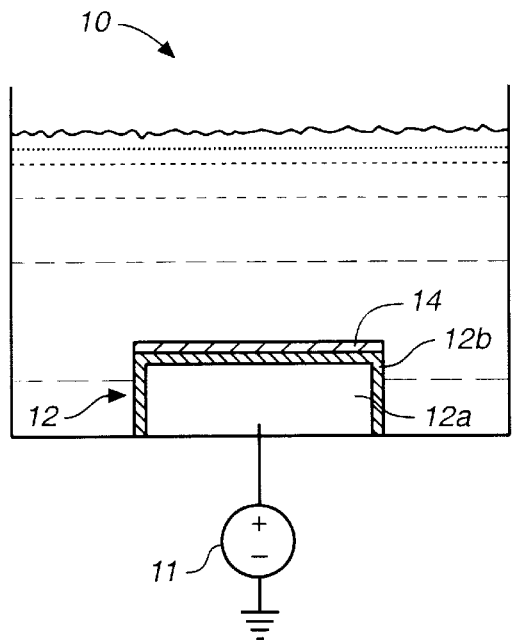
FIG._1A
(PRIOR ART)
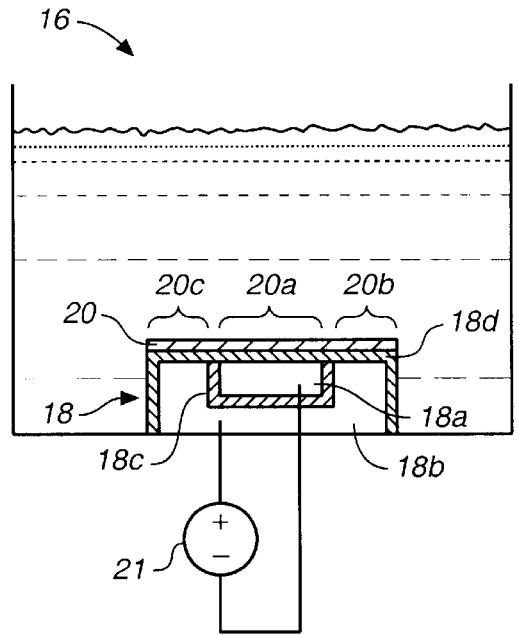
FIG._1B
(PRIOR ART)
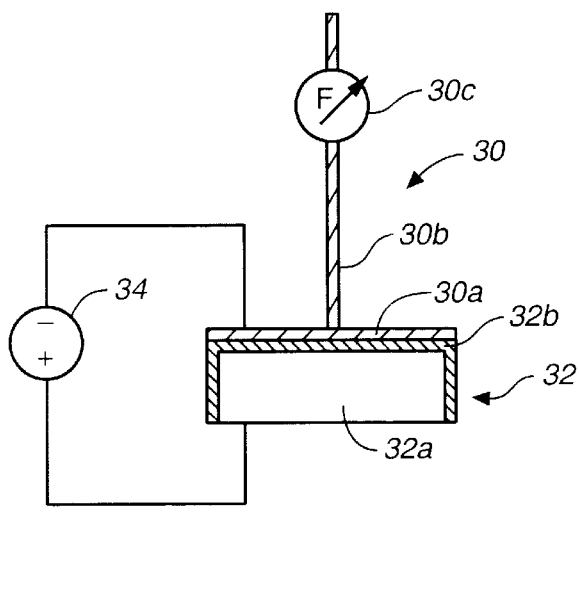
FIG._2A
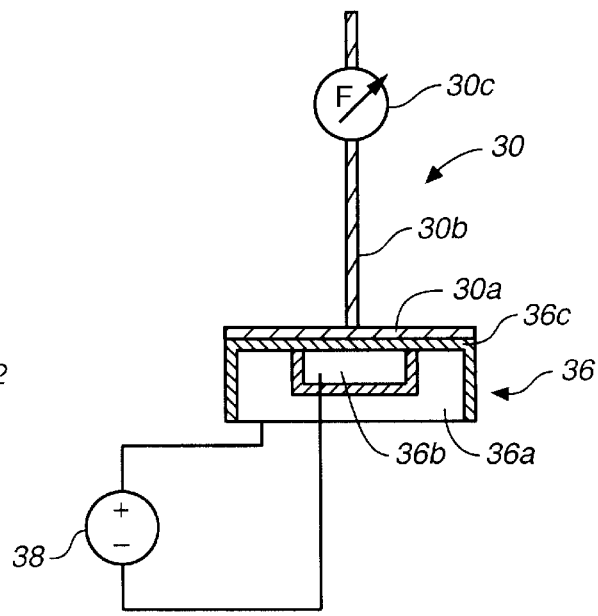
FIG._2B

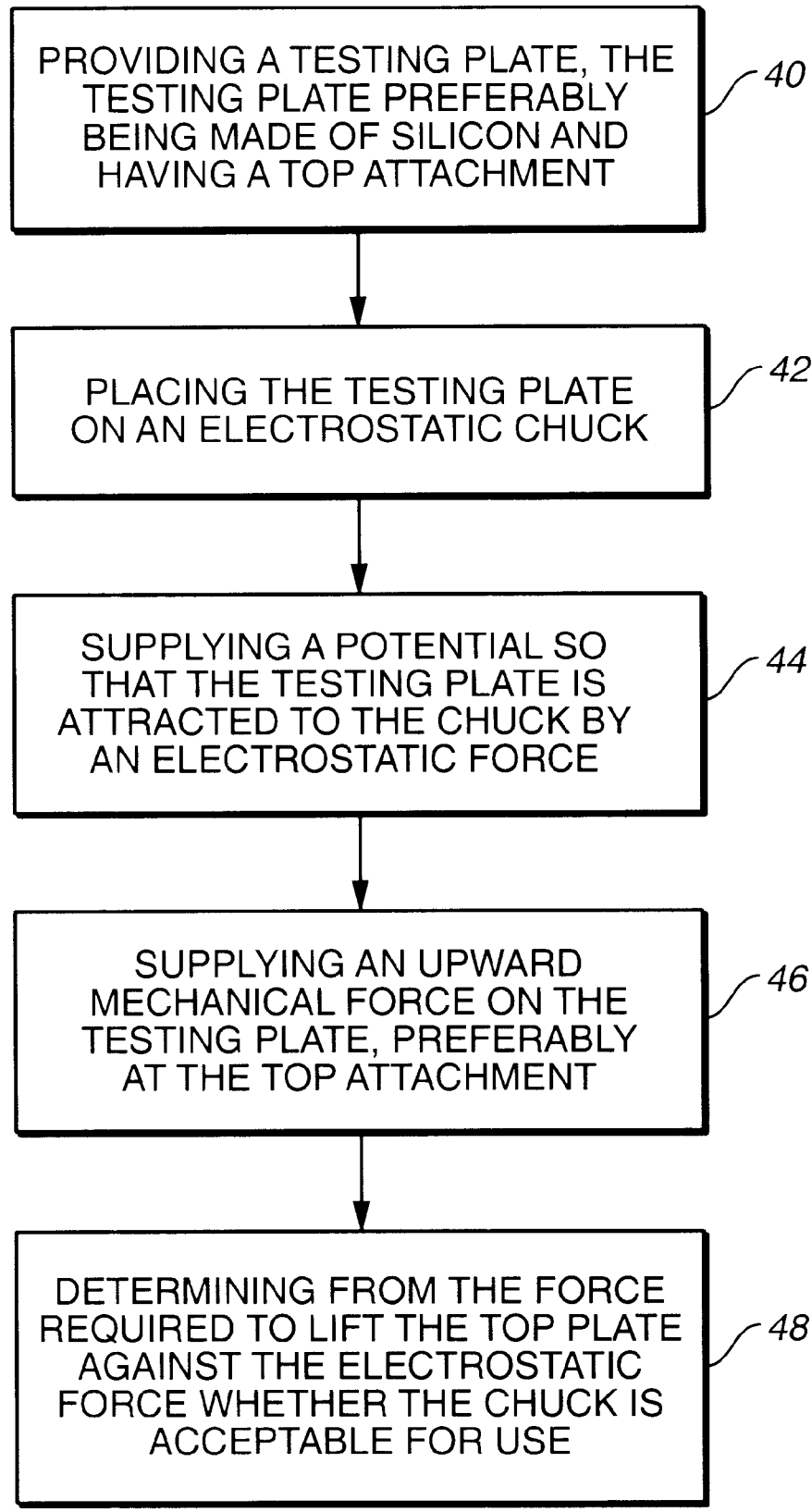
FIG._3

TECHNIQUE AND APPARATUS FOR TESTING ELECTROSTATIC CHUCKS

BACKGROUND OF THE INVENTION

The present invention relates to electrostatic chucks. Semiconductor wafers need to be securely held in place during processing. In some wafer processing machines, the wafer is held in place by an electrostatic chuck. An electrostatic chuck uses an electrostatic force to hold the wafer. The electrostatic force is produced by a voltage difference between the wafer and a conductive portion of the chuck across a dielectric portion of the chuck. Electrostatic chucks are typically made of a metal material with a thin dielectric coating. For example, an aluminum chuck with an aluminum-oxide coating could be used. Alternately, the dielectric layer could be formed of a polyamide or ceramic material.

FIG. 1A shows a prior art unipolar chuck 12. The chuck 12 includes a conductive portion 12a and a dielectric portion 12b. The wafer 14 is placed on the chuck 12. The metallic portion 12a is positively biased by DC power supply 11 and the plasma produced in the chamber 10 supplies electrons onto the wafer 14. The electrons in the wafer 14 migrate toward the positively biased metal portion 12a of the chuck 12 but cannot cross the dielectric layer 12b. The voltage difference across the dielectric layer 12d will produce an electrostatic force which will hold the wafer 14 to the chuck.

FIG. 1B shows a bipolar chuck 18. The bipolar chuck has two poles: pole 18a and pole 18b. These poles are separated by a dielectric layer 18c and the chuck is covered by the dielectric layer 18d. In the bipolar chuck, DC power supply 21 is used to make one of the poles, 18b, positively charged and the other pole 18a negatively charged. This will cause mobile electrons in the wafer 20 to migrate into regions 20c and 20b away from region 20a. This will cause the region 20a to become positively charged. In this manner, an electrostatic force is produced between the wafer 20 and the chuck 18.

Typically, both types of electrostatic chucks include air flow grooves for cooling the wafer, liquid cooling pipes for cooling the chuck, and screw holes for attachment of the chuck to the chamber. The manufacturer typically includes a number indicating the highest level of air flow that can be used with the chucks.

It is desired to have a method of testing wafer chucks.

SUMMARY OF THE INVENTION

The present invention comprises a testing method in which a potential is supplied to a chuck so that a testing plate is attracted to the chuck by electrostatic force. An upward mechanical force is used on the plate so that an indication of the electrostatic force is produced. An advantage of such a testing method is that the user can determine an electrostatic force provided by the chuck for a given potential. This allows for qualifying the electrostatic chuck without putting the electrostatic chuck in the chamber. For this reason, the wafer or the wafer processing machine will not be harmed by a bad electrostatic chuck.

In a preferred embodiment, the testing plate is made of a silicon material of a similar size and shape as the silicon wafer. The upward mechanical force can be provided by a spring, a hydraulic cylinder, or an electronic device such as a solenoid. The level of applied force can be read off an indicator such as a strain gauge or load cell.

The method of the present invention can be used with both unipolar and bipolar chucks. When used with unipolar chucks, a DC power supply is used to produce a potential between the conductive portion of the chuck and the testing plate. When used with a bipolar chucks, the DC power supply is connected between the two poles of the chuck.

BRIEF DESCRIPTION OF THE DRAWINGS

The above and other features and aspects of the present invention will become more apparent upon reading the following detailed description in conjunction with the accompanying drawings, in which:

FIG. 1A is a diagram of a prior art unipolar chuck;

FIG. 1B is a diagram of a prior art bipolar chuck;

FIG. 2A is a diagram of a testing apparatus of the present invention for use with a unipolar chuck;

FIG. 2B is a diagram of a testing apparatus of the present invention for use with the bipolar chuck; and FIG. 3 is a flow chart illustrating a method of the present invention.

DETAILED DESCRIPTION OF THE PREFERRED EMBODIMENT

FIG. 2a is a diagram illustrating the testing apparatus 30 of the present invention for use with a unipolar chuck 32. The testing apparatus 30 includes a testing plate 30a. The testing plate is preferably comprised of silicon material, and preferably shaped to be the same size as the silicon wafer. The chuck 32 has a conductive pole 32a, and a dielectric layer 32b. A DC power supply 34 is connected between the conductive portion 32a of the chuck 32 and the test plate 30a. In the embodiment shown in FIG. 2A, electrons will migrate through the testing plate 30a and be attracted to the positive charge on the conductive portion 32a of the chuck 32. Some of the electrons on the testing plate 30a are prevented by the dielectric layer 32b from migrating to the conductive area 32a so that an electrostatic force is produced. Counter to the electrostatic force, an upward mechanical force can be provided by mechanism 30b. The upward force can be provided by a mechanical spring, a hydraulic cylinder, or an electronic device such as a solenoid. The testing mechanism also includes an indicator 30c, which indicates the level of the upward force. This can be, for example, a strain gauge or load cell. Note that by using the testing apparatus 30 of the present invention, the wafer chuck can be tested before it is placed into the semiconductor processing machine.

FIG. 2B shows the testing apparatus 30 of the present invention for use with a bipolar chuck 36. In the bipolar chuck 36, a DC power supply 38 is hooked up between the pole 36a and the pole 36b. These poles are separated by a dielectric region (not shown). The DC power supply 38 causes electrons in the testing plate 30a to migrate and an electrostatic force to be produced. The testing apparatus 30 in FIG. 2B operates as described above for FIG. 2A.

FIG. 3 is a flow chart illustrating the method of the present invention. In step 40, a testing plate is provided. The testing plate is preferably made of silicon and has a top attachment which allows for an upward mechanical force to be supplied. The testing plate can also be made of any other conductive material. In step 42, this testing plate is put on the electrostatic chuck. In step 44, a potential is supplied so that the testing plate is attracted to the chuck by an electrostatic force. This can be done for a bipolar or a unipolar chuck. In step 46, an upward mechanical force is supplied to the testing plate. In step 48, the mechanical force required to lift the top plate against the electrostatic force is determined. In the method of the present invention, the chucks are considered acceptable if they produce a predetermined level of electrostatic force (as measured by the upward mechanical force when the testing plate separates from the clamp) for a given DC potential. If the wafer clamp does not produce this predetermined level of electrostatic force, the wafer clamp is rejected. In a preferred embodiment, the testing is done outside of the wafer processing chamber so that the failure of a wafer chuck will not damage any wafers or the wafer processing chamber itself.

Various details of the implementation and method are merely illustrative of the invention. It will be understood that various changes in the details may be within the scope of the invention, which is to be limited only by the appended claims.

What is claimed is:

1. A method of testing an electrostatic chuck adapted to apply an electrostatic force for holding a semiconductor wafer during processing, comprising:

provided a testing plate of similar size as the semiconductor wafer;

placing the testing plate on the electrostatic chuck;

supplying a known potential to at least the chuck so that the testing plate is attracted to the chuck by an electrostatic force needed to securely hold the semiconductor wafer during processing;

supplying a mechanical force in a direction opposing the electrostatic force on the plate such that the mechanical force is large enough to overcome the electrostatic force and thus to separate the testing plate from the chuck; and measuring the mechanical force to give an indication of the quality of the chuck.

2. The method of claim 1, wherein the electrostatic chuck is a unipolar chuck.

3. The method of claim 2, wherein the potential is connected between the testing plate and a pole of the unipolar chuck.

4. The method of claim 1, wherein the electrostatic chuck is a bipolar chuck.

5. The method of claim 4, wherein the potential is connected between two poles of the bipolar chuck.

6. The method of claim 1, wherein the testing plate is made of silicon.

7. The method of claim 1, wherein the mechanical force is supplied by a spring scale.

8. The method of claim 1, wherein the mechanical force is supplied by a hydraulic cylinder.

9. The method of claim 1, wherein the mechanical force is supplied by an electric device.

10. The method of claim 1, wherein the supplying and measuring steps are done outside of a semiconductor processing chamber.

11. The method of claim 1, wherein the measuring the mechanical force measures by a strain gauge or a load cell.

12. An apparatus for testing an electrostatic chuck adapted to apply an electrostatic force for holding a semiconductor wafer during processing, comprising:

a testing plate of similar size as the semiconductor wafer shaped to contact a top surface of the electrostatic chuck;

a power supply adapted to supply a known potential to at least the chuck so that the testing plate is attracted to the chuck by an electrostatic force needed to securely hold the semiconductor wafer during processing;

a device attached to the testing plate, the device adapted to supply a mechanical force in a direction opposing the electrostatic force on the testing plate such that the mechanical force is large enough to overcome the electrostatic force and thus to separate the testing plate from the chuck; and an indicator attached to the device wherein the indicator measures the mechanical force so as to determine the quality of the chuck.

13. The apparatus of claim 12, wherein the electrostatic chuck is a unipolar chuck and the power supply is connected between the testing plate and a pole of the unipolar chuck.

14. The apparatus of claim 12, wherein the electrostatic chuck is a bipolar chuck and the power supply is connected between two poles of the bipolar chuck.

15. The apparatus of claim 12, wherein the testing plate is made of silicon.

16. The apparatus of claim 12, wherein the device includes a spring scale.

17. The apparatus of claim 12, wherein the device includes a hydraulic cylinder.

18. The apparatus of claim 12, wherein the device is an electric device.

19. The apparatus of claim 12, wherein the indicator includes a strain gauge or a load cell.

* * * * *